United States Patent
Mangano et al.

(10) Patent No.: US 9,823,965 B2
(45) Date of Patent: Nov. 21, 2017

(54) METHOD OF MANAGING MEMORIES, CORRESPONDING DEVICE AND APPARATUS

(71) Applicants: STMicroelectronics Design and Application s.r.o., Prague (CZ); STMicroelectronics S.R.L., Agrate Brianza (IT)

(72) Inventors: Daniele Mangano, San Gregorio di Catania (IT); Michele Alessandro Carrano, Catania (IT); Gaetano Di Stefano, San Pietro Clarenza (IT); Antonin Fried, Prague (CZ)

(73) Assignees: STMicroelectronics S.r.l., Agrate Brianza (IT); STMicroelectronics Design and Application S.R.O., Prague (CZ)

( * ) Notice: Subject to any disclaimer, the term of this patent is extended or adjusted under 35 U.S.C. 154(b) by 0 days.

(21) Appl. No.: 15/080,307

(22) Filed: Mar. 24, 2016

(65) Prior Publication Data
US 2017/0068594 A1    Mar. 9, 2017

(30) Foreign Application Priority Data
Sep. 3, 2015  (IT) .......................... 102015000048379

(51) Int. Cl.
*G06F 11/10* (2006.01)
*G11C 29/52* (2006.01)

(52) U.S. Cl.
CPC ...... *G06F 11/1068* (2013.01); *G06F 11/1044* (2013.01); *G11C 29/52* (2013.01)

(58) Field of Classification Search
CPC ............. G06F 11/1044; G06F 11/1068; G06F 11/108; G11C 29/42; G11C 29/52; G11C 2207/104
See application file for complete search history.

(56) References Cited

U.S. PATENT DOCUMENTS

| | | |
|---|---|---|
| 2007/0220401 A1 | 9/2007 | Bains |
| 2008/0005646 A1 | 1/2008 | Bains |
| 2009/0249169 A1 | 10/2009 | Bains et al. |
| 2014/0068319 A1* | 3/2014 | Daly .................. G11C 7/1006 714/6.2 |
| 2014/0281813 A1* | 9/2014 | Wakchaure .......... G06F 11/108 714/766 |

* cited by examiner

*Primary Examiner* — Shelly A Chase
(74) *Attorney, Agent, or Firm* — Seed IP Law Group LLP

(57) ABSTRACT

A method includes: writing first data in a first partition of a first memory module and second data in a first partition of a second memory module, and selectively operating the first and second memory modules in a first operating mode and a second operating mode. The first operating mode includes writing parity bits for the first data in a second partition of the second memory module and parity bits for the second data in a second partition of the first memory module. The second operating mode includes writing further data instead of parity bits in the second partition of one or both the first memory module and the second memory module.

19 Claims, 5 Drawing Sheets

FIG. 5
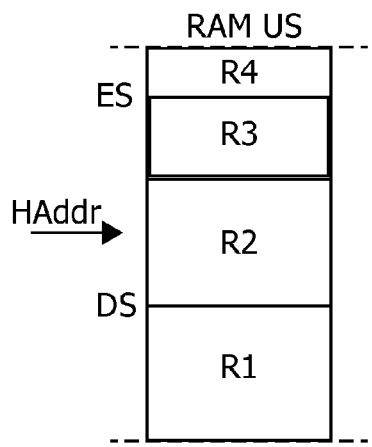
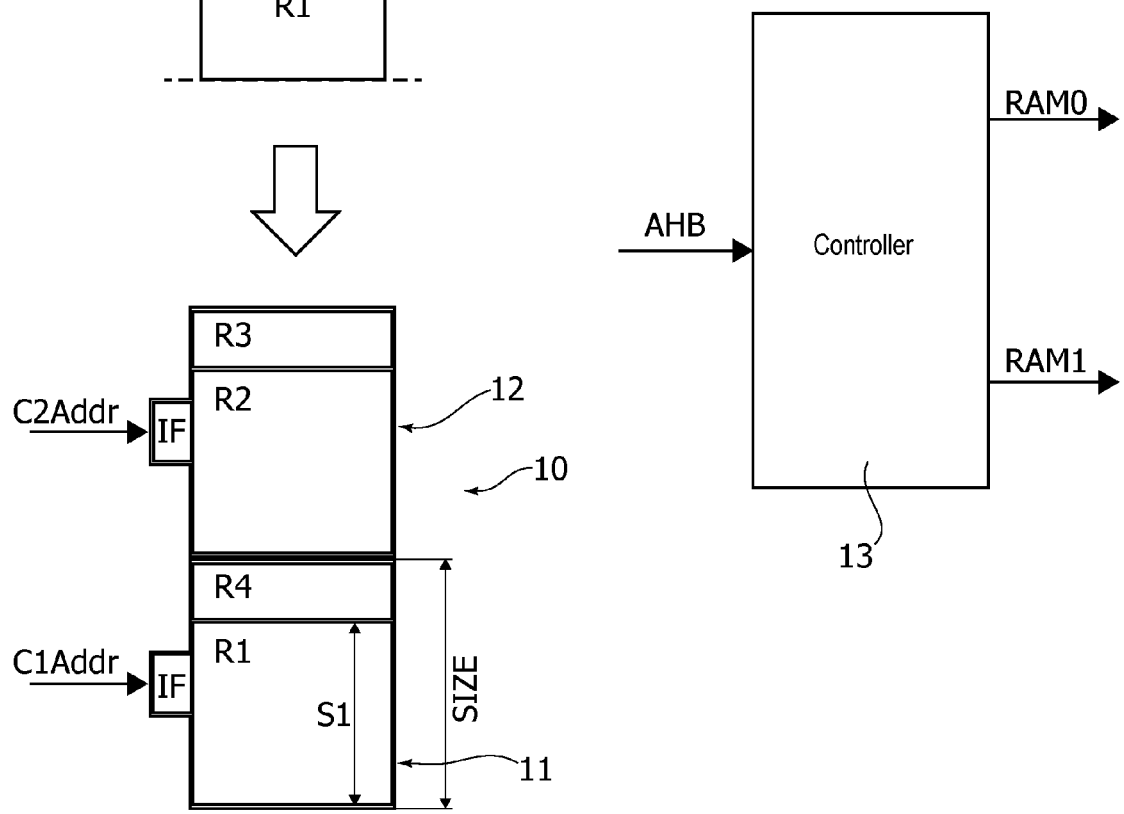
FIG. 6

METHOD OF MANAGING MEMORIES, CORRESPONDING DEVICE AND APPARATUS

BACKGROUND

Technical Field

The description relates to managing memories.

One or more embodiments may apply to managing semiconductor memories such as, e.g., embedded random access memories (RAMs).

Description of the Related Art

Management of semiconductor memories such as parity management in embedded RAMs, as used, e.g., in microcontroller units (MCUs), systems-on-chip (SoCs), may be a key factor in certain applications and be hardly of interest for other applications.

Dedicating a part of a memory array to parity management (e.g., with words by 36 bits for 32 bit data, words by 72 bits for 64 bit data, and so on) may add to the cost of a memory array, also in terms of die size and semiconductor module, with the risk that these added cost factors may turn out to be unjustified for those applications that do not take advantage of them.

BRIEF SUMMARY

One or more embodiments of the present disclosure provide improvements to prior art memory management.

One or more embodiments are directed to a method of managing memories that writes first data in a first partition of a first memory module having first and second partitions, writes second data in a first partition of a second memory module having first and second partitions, and selectively operates the first and second memory modules in a first operating mode and a second operating mode. The first operating mode includes writing parity bits for the first data in the second partition of the second memory module and writing parity bits for the second data in the second partition of the first memory module. The second operating mode includes writing further data instead of the parity bits in the second partition of at least one of the first memory module and the second memory module.

One or more embodiments may relate to a corresponding memory device (e.g., a memory array) and a corresponding apparatus (such as a MCU, a SoC, and so on) including such a device.

The claims are an integral part of the disclosure of one or more exemplary embodiments as provided herein.

One or more embodiments may provide memories such as RAMs offering adequate performance at, e.g., one data word for clock cycle.

One or more embodiments may involve building a dual-memory (e.g., dual RAM) structure adapted to be used in a flexible manner by selectively devoting at least a portion of the memory either to parity or data.

BRIEF DESCRIPTION OF THE SEVERAL VIEWS OF THE DRAWINGS

One or more embodiments will now be described, by way of example only, with reference to the annexed figures, wherein:

FIGS. 4 to 6 provide further details of possible management of memories according to one or more embodiments.

DETAILED DESCRIPTION

Figure 1:
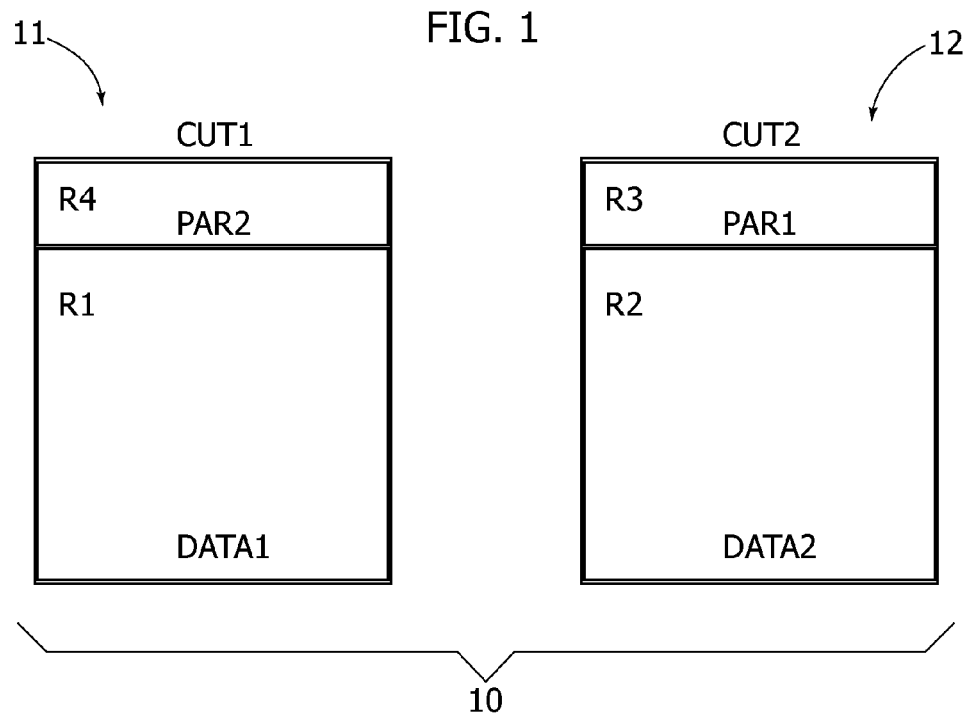
FIG. 1 is exemplary of memory management according to one or more embodiments.

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference 10 denotes a memory such as a semiconductor memory.

A RAM is exemplary of a memory to which one or more embodiments may apply.

In one or more embodiments, the memory 10 may be arranged to include a first memory module 11 (CUT1) and a second memory module 12 (CUT2).

Designating the memory modules 11 and 12 as "cuts" highlights the possibility of providing the first and second memory modules 11, 12 as portions of a same memory unit; in one or more embodiments, the memory modules 11, 12 may however be provided as separate memory units.

In one or more embodiments each memory module 11, 12 may include two partitions.

For instance, the memory module 11 may include a first partition R1 and a second partition R4 while the second memory module 12 may include a first partition R2 and a second partition R3.

In one or more embodiments, the memory 10 may be configured (in a manner known per se, and possibly as further detailed in the following) so that:

first data DATA1 may be written into (and correspondingly read from) the first partition R1 of the first memory module 11, and second data DATA2 may be written into (and correspondingly read from) the first partition R2 of the second memory module 12.

Also, one or more embodiments may envisage operating the first and second memory modules 11 and 12:

in a first operating mode, wherein parity bits PAR1 for the first data DATA1 are written in the second partition R3 of the second memory module 12 while parity bits PAR2 for the second data DATA2 are written in the second partition R4 of the first memory module 11, and in at least one second operating mode, wherein at least one (e.g., one or both) of the second partitions R3, R4 in the memory modules 11, 12 is not used for storing parity bits PAR1, PAR2 but used to store further data in the place of the parity bits.

Figure 2:
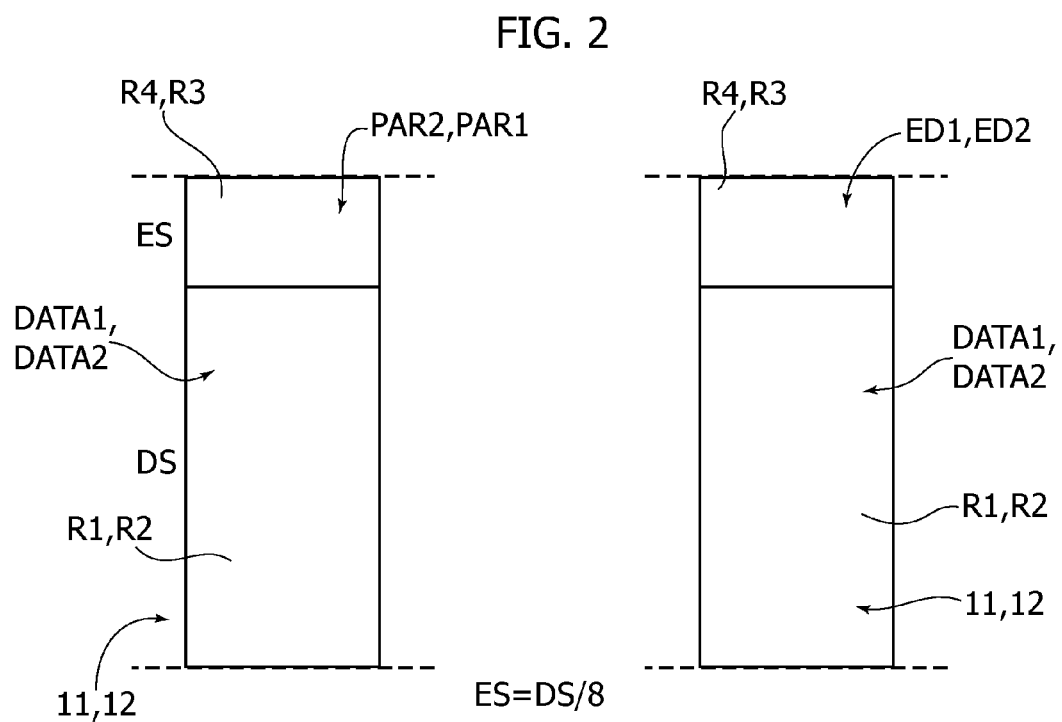
FIG. 2 is further exemplary of memory management according to one or more embodiments.

FIG. 2 is a comparative representation showing:

on the left-hand side, a first operating mode where the second partition R4, R3 of the memory modules 11, 12 are used to store parity bits PAR1, PAR2 for the data DATA1, DATA2 stored in the first partitions R1, R2; and on the right-hand side, a second operating mode where the second partitions R4, R3 of both modules 11 and 12 no longer host parity bits PAR1, PAR2 and may thus be devoted to storing extra data ED1, ED2 in the place of the parity bits PAR1, PAR2.

The two portions (left-side and right-side) of FIG. 2 may be regarded as exemplary of how, in one or more embodiments a memory space (e.g., RAM) may be seen by a user (i.e., by software) in two cases of parity enabled and parity disabled.

In one or more embodiments a "cross-wise" structure as detailed in the following was found to be adequate for implementing a configurable parity feature, possibly by resorting to address remapping, that is to translating user addresses into physical addresses mapped on R1/R2/R3/R4.

One or more embodiments may be configured to implement a "cross-wise" write (and read) arrangement such that:

parity bits PAR1 for the data DATA1 stored in the first memory module 11 (partition R1) are stored in the second memory module 12 (partition R3) and, correspondingly parity bits PAR2 for the data DATA2 stored in the second memory module 12 (partition R2) are stored in the first memory module 11 (partition R4).

In one or more embodiments, storing extra data ED1, ED2 in memory space R3, R4 otherwise usable for parity bits may involve using the same word size.

In one or more embodiments, the two memory modules 11, 12 may have the same size (e.g., a same storage capability) so that, e.g., single Built-In Self-Test (BIST) may be shared by the modules 11, 12 thus reducing testing time, e.g., to a half.

In one or more embodiments, the first partitions R1, R2 and the second partitions R4, R3 can be mutually dimensioned with the second partitions R4, R3 having a size ES which is a sub-multiple of the size DS of the first partitions R1, R2, e.g., DS/8.

In one or more such embodiments a one parity word may thus be coupled to 8 data words.

In one or more embodiments, operation may be based on 32-bit words with one parity word associated to 8 data words that is with a write mask having a bit granularity adequate to support data write bites.

Different dimensioning options may be applied in one or more embodiments.

Figure 3:
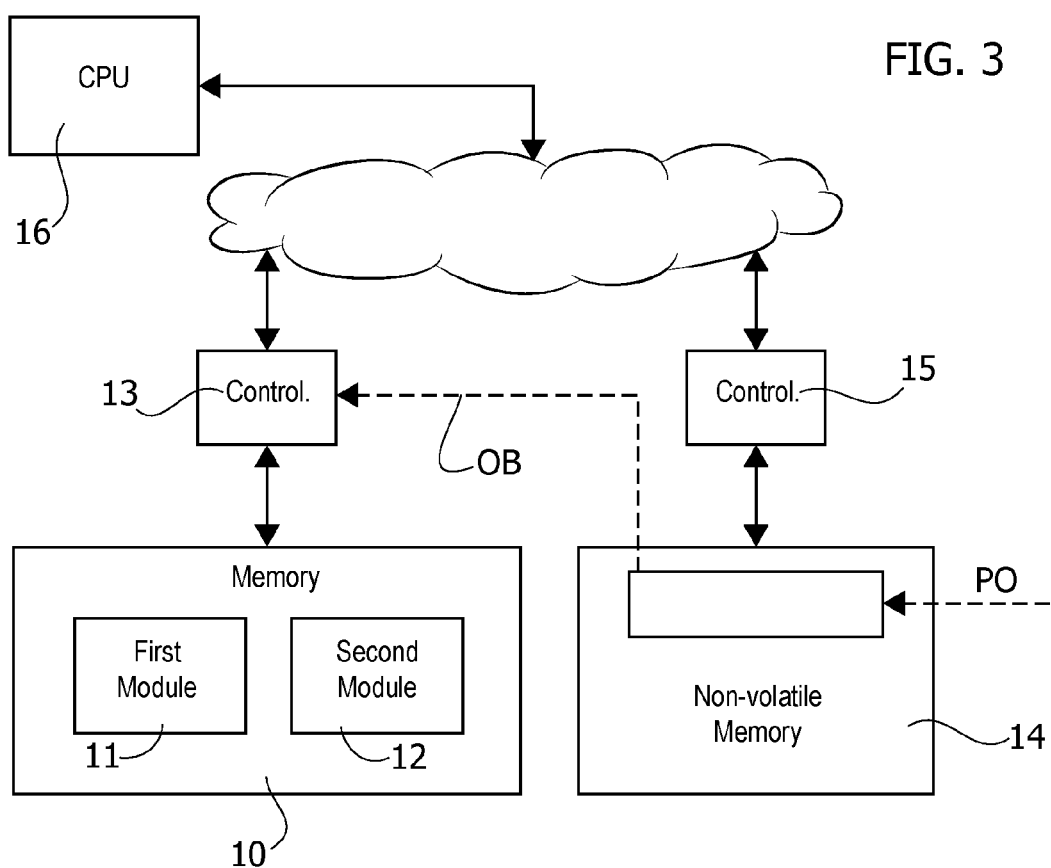
FIG. 3 is a functional block diagram exemplary of a hardware arrangement according to one or more embodiments.

In one or more embodiments write events in the partitions R3, R4 may generate access errors if parity is enabled (see, e.g., left-hand side of FIG. 2 and the signal OB in FIG. 3).

The functional block diagram of FIG. 3 is exemplary of the possibility of managing various operating modes as exemplified in the foregoing by hardware, that is with a RAM control module 13 configured to switch the memory 10 (including the modules 11, 12) to different operating modes, e.g., based on option bits OB as possibly stored in a non-volatile memory 14.

In one or more embodiments, the memory 14 may be configured, e.g., to receive an external parity option signal PO indicating whether parity bit operation is intended to be adopted in the memory modules 11, 12 under the control of a control module 15 for the non-volatile memory 14.

In one or more embodiments the control modules 13, 15 may operate under the (possibly remote) control of a central processing unit or CPU 16.

One or more embodiments as exemplified in FIG. 3 therefore permit parity bits write to be fully managed by hardware without giving rise to RAM bandwidth limitations.

Figure 4:
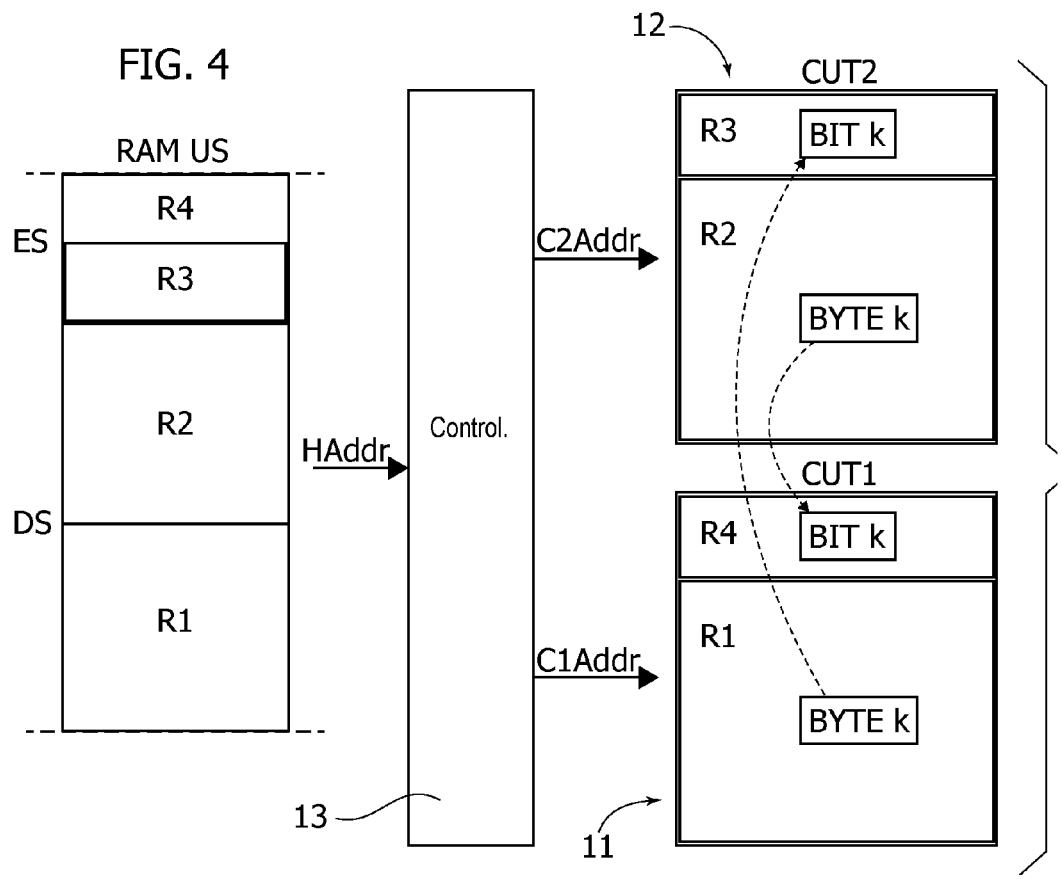

The diagram of FIG. 4 is exemplary of the possibility of achieving full bandwidth by means of a symmetrical dual-RAM structure 11, 12 allowing parallel writing (and reading) of data and parity bits (when used).

In one or more embodiments, such parallel operation may be made possible by the "cross-wise" write arrangement already discussed in the foregoing which provides for DATA1 stored in partition R1 of module 11 having their respective parity bits PAR1 stored in partition R3 of module 12 while DATA2 stored in partition R2 of module 12 have their respective parity bits PAR2 stored in partition R4 of module 11.

The left hand side of the diagram of FIG. 4 is exemplary of how the various partitions R1, R2, R3, R4 of the memory modules 11, 12 may be configured in a RAM user space (RAM US), e.g., for controller 13.

The exemplary representation of FIG. 4 (where the assumption is again made that the two modules 11 and 12 may be of a same size (DS+ES)/2, where DS and ES denote the respective sizes of the first partitions R1, R2 and the second partitions R4, R3) shows that the "physical" neighborhood of the partitions R1, R4 (in the module 11) and the partitions R2, R3 (in the module 12) may not map into a corresponding neighborhood in the RAM user space.

In one or more embodiments, the RAM controller 13 may be configured to drive the two memory modules 11, 12 by resorting to a dual-port architecture enabling parallel writes, e.g., C1Addr for the module 11 or CUT1 and C2Addr for the module 12 or CUT2, possibly with address re-mapping (HAddr).

In one or more embodiments as=$\log_2$(SIZE) may represent the number of address bits of C1Addr and C2Addr, where SIZE is the number of words and S1 denotes the size of the partitions R1 and R2 in number of words (which may be derived from SIZE) and start HAddr may represent a start user space address which may be assumed to be aligned to SIZE.

FIGS. 5 and 6 are exemplary of possible criteria which may be adopted in mapping the RAM user space RAM US (receiving HAddr as an input) into the RAM physical space of the modules 11, 12 with respective signals C1Addr and C2Addr fed to (e.g., input interfaces IF) of the modules 11 and 12 via the RAM controller 13.

As depicted in FIG. 6 the RAM controller 13 may have an input port AHB and two respective output ports RAMO, RAM2 as shown in FIG. 6.

By way of example, in an operational mode providing for parity bit management (PO=enabled) the addresses for the partitions R3/R4 intended to receive the parity bits PAR1, PAR2 may be generated by off-setting and dividing HAddr, e.g., as exemplified in the following, where HAddr and MWEN denote AHB address and RAM write enable (e.g., active low), respectively.

| HAddr belongs to R1 → | C1Addr = HAddr(as + 1:2)<br>C2Addr = S1 + C1Addr(as − 1:3) | MWEN = f1(HAddr(1:0), HSIZE)<br>MWEN = f2(HAddr(4:0), HSIZE) |
|---|---|---|

-continued

| | | |
|---|---|---|
| HAddr belongs to R2 → | Haddr' = Haddr − S1 * 4<br>C1Addr = S1 + C2Addr(as − 1:3)<br>C2Addr = HAddr(as + 1:2) | MWEN = f2(HAddr'(4:0), HSIZE)<br>MWEN = f1(HAddr'(1:0), HSIZE) |
| HAddr belongs to R3/R4 → | ERROR | |

In a mode of operation providing for the partitions R3/R4 being used for data storage (and not for storing parity bits) only one module or cut may be accessed per time, e.g., based on the following approach.

| | | |
|---|---|---|
| HAddr belongs to R1 → | C1Addr = HAddr(as + 1:2) | MWEN = f1(HAddr(1:0), HSIZE) |
| HAddr belongs to R2/R3 → | Haddr' = Haddr − S1 * 4<br>C2Addr = HAddr'(as + 1:2) | MWEN = f1(HAddr'(1:0), HSIZE) |
| HAddr belongs to R4 → | Haddr' = Haddr − SIZE * 4<br>C1Addr = HAddr'(as + 1:2) | MWEN = f1(HAddr'(1:0), HSIZE) |

Figure 7:
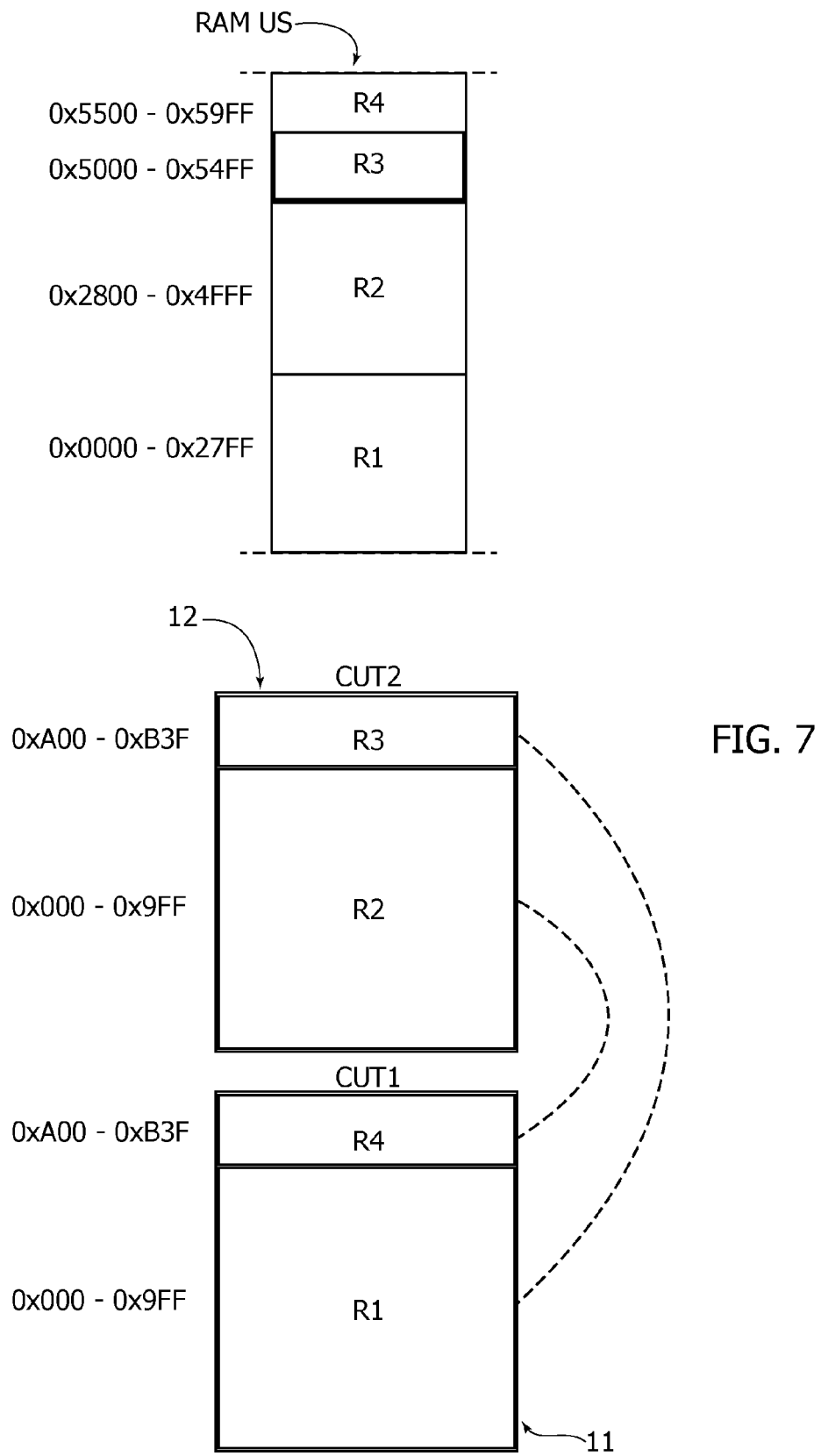
FIG. 7 is exemplary of possible dimensioning of a memory according to one or more embodiments.

FIG. 7 is exemplary of a possible arrangement of a memory map as per the memory map reproduced in the following, where PO=En and PO=Dis denote Parity Operation enabled and disabled, respectively.

| MAPPING | ADDRESS | OPTION | DESCRIPTION | CUT1 | CUT2 | SIZE |
|---|---|---|---|---|---|---|
| SRAM | 0x20005500 | PO = En | R4→Reserved | NO ACCESS | NO ACCESS | 1.25 KB |
| | 0x200059FF | PO = Dis | R4→ DATA | DATA<br>0xA00<br>0xB3F | NO ACCESS | |
| | 0x20005000 | PO = En | R3→Reserved | NO ACCESS | NO ACCESS | 1.25 KB |
| | 0x200054FF | PO = Dis | R3→ DATA | NO ACCESS | DATA<br>0xA00<br>0xB3F | |
| | 0x20002800<br>0x20004FFF | PO = En | R2→ DATA | PARITY<br>0xA00<br>0xB3F | DATA<br>0x000<br>0x9FF | 10 KB |
| | | PO = Dis | R2→ DATA | NO ACCESS | DATA<br>0x000<br>0x9FF | |
| | 0x20000000<br>0x200027FF | PO = En | R1→ DATA | DATA<br>0x000<br>0x9FF | PARITY<br>0xA00<br>0xB3F | 10 KB |
| | | PO = Dis | R1→ DATA | DATA<br>0x000<br>0x9FF | NO ACCESS | |

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of managing memories comprising:
    writing first data in a first partition of a first memory module having first and second partitions;
    writing second data in a first partition of a second memory module having first and second partitions;
    selectively operating said first and second memory modules in a first operating mode and a second operating mode, wherein:
        said first operating mode includes writing parity bits for said first data in the second partition of the second memory module and writing parity bits for said second data in the second partition of the first memory module, and
        said second operating mode includes writing further data instead of the parity bits in the second partition of at least one of the first memory module and the second memory module.

2. The method of claim 1, wherein said second operating mode includes writing the further data instead of the parity bits in the second partitions of both of the first memory module and the second memory module.

3. The method of claim 1, wherein said first and second memory modules are of a same size.

4. The method of claim 1, including selecting a size of said second partitions as a sub-multiple of a size of said first partitions.

5. The method of claim 1, wherein said parity bits include one parity word to 8 data words in said first partitions.

6. The method of claim 1, including configuring said first and second memory modules for dual-port parallel writes.

7. The method of claim 6, wherein the configuring includes configuring said first and second memory modules for dual-port parallel writes using address remapping.

8. A memory device, comprising:
    a first memory module including first and second partitions;
    a second memory module including first and second partitions;
    a memory controller configured to write first data in the first partition of the first memory module and second data in the first partition of the second memory module, the memory controller configured to selectively operate said first and second memory modules in a first operating mode and a second operating mode, wherein:

in said first operating mode, parity bits for said first data are written in the second partition of the second memory module and parity bits for said second data are written in the second partition of the first memory module, in said at least one second operating mode further data are written instead of the parity bits in the second partition of at least one of the first memory module and the second memory module.

9. The memory device of claim 8, wherein said memory controller is configured to operate said first and second memory modules in a said at least one second operating mode wherein further data are written instead of parity bits in the second partitions of both of the first memory module and the second memory module.

10. The memory device of claim 8, wherein:

said first and second memory modules are of a same size.

11. The memory device of claim 8, wherein:

a size of said second partitions is a sub-multiple of a size of said first partitions.

12. The memory device of claim 8, wherein:

said parity bits include one parity word to 8 data words in said first partitions.

13. The memory device of claim 8, wherein:

said memory controller and said first and second memory modules are configured for dual-port parallel writes.

14. The memory device of claim 13, wherein:

said memory controller and said first and second memory modules are configured for dual-port parallel writes using address remapping.

15. A system, comprising:
a processor; and
a memory device coupled to the processor and including:
a first memory module including first and second partitions;
a second memory module including first and second partitions;
a memory controller configured to write first data in the first partition of the first memory module and second data in the first partition of the second memory module, the memory controller configured to selectively operate said first and second memory modules in a first operating mode and a second operating mode, wherein:
in said first operating mode, parity bits for said first data are written in the second partition of the second memory module and parity bits for said second data are written in the second partition of the first memory module,
in said at least one second operating mode further data are written instead of the parity bits in the second partition of at least one of the first memory module and the second memory module.

16. The system of claim 15, wherein said memory controller is configured to operate said first and second memory modules in a said at least one second operating mode wherein further data are written instead of parity bits in the second partitions of both of the first memory module and the second memory module.

17. The system of claim 15, wherein:

said first and second memory modules are of a same size.

18. The system of claim 15, wherein:

said memory controller and said first and second memory modules are configured for dual-port parallel writes.

19. The system of claim 18, wherein:

said memory controller and said first and second memory modules are configured for dual-port parallel writes using address remapping.

* * * * *